United States Patent
Lv et al.

(10) Patent No.: US 9,167,712 B2
(45) Date of Patent: Oct. 20, 2015

(54) RADIO REMOTE UNIT DEVICE AND ASSEMBLY THEREOF

(71) Applicant: Huawei Technologies Co., Ltd., Shenzhen (CN)

(72) Inventors: Jinsong Lv, Shanghai (CN); Chenglong Wang, Shenzhen (CN); Haowen Xu, Shanghai (CN); Zuojun Qin, Shanghai (CN); Haizheng Tang, Shanghai (CN); Lili Guo, Shanghai (CN); Jin Jiang, Shanghai (CN); Zhongxin Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 271 days.

(21) Appl. No.: 13/907,089

(22) Filed: May 31, 2013

(65) Prior Publication Data

US 2014/0043767 A1    Feb. 13, 2014

(30) Foreign Application Priority Data

Aug. 13, 2012   (CN) .......................... 2012 1 0286417

(51) Int. Cl.
*H05K 7/20*     (2006.01)
*H05K 7/02*     (2006.01)
*H01Q 1/24*     (2006.01)
*H02B 1/26*     (2006.01)
*H04B 1/036*    (2006.01)
*H04W 88/08*    (2009.01)

(52) U.S. Cl.
CPC ............... *H05K 7/026* (2013.01); *H01Q 1/246* (2013.01); *H02B 1/26* (2013.01); *H04B 1/036* (2013.01); *H04W 88/085* (2013.01); *H05K 7/20409* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,634,732 A | * | 1/1972 | Finger et al. | 361/726 |
| 6,038,129 A | * | 3/2000 | Falaki et al. | 361/699 |
| 6,411,515 B1 | * | 6/2002 | Sakamoto et al. | 361/704 |
| 7,355,848 B1 | * | 4/2008 | Hodge et al. | 361/690 |
| 8,488,312 B2 | * | 7/2013 | Nelson et al. | 361/679.47 |
| 8,549,741 B2 | * | 10/2013 | Nelson et al. | 29/834 |
| 8,599,540 B2 | * | 12/2013 | Fernandez | 361/679.01 |
| 2002/0036892 A1 | | 3/2002 | Sakamoto et al. | |
| 2008/0285231 A1 | * | 11/2008 | Fischer et al. | 361/690 |

(Continued)

FOREIGN PATENT DOCUMENTS

| CN | 201278528 Y | 7/2009 |
|---|---|---|
| CN | 101645714 A | 2/2010 |

(Continued)

*Primary Examiner* — Gregory Thompson
(74) *Attorney, Agent, or Firm* — Brinks Gilson & Lione

(57) ABSTRACT

Embodiments of the present invention relate to an RRU device and an assembly thereof. The RRU device includes: an enclosure, where the enclosure includes a front-end plate and a back-end plate that are respectively set on two lengthwise ends of the enclosure, multiple parallel spaced heat sinks are set on two widthwise sides of the enclosure and between the front-end plate and the back-end plate, and the front-end plate and the back-end plate extend along a widthwise direction of the enclosure by a length which is greater than a length by which the heat sinks extend; and a joint part set on the enclosure, where the joint part is used to fasten two side-by-side radio remote unit devices together.

10 Claims, 12 Drawing Sheets

(56) References Cited

U.S. PATENT DOCUMENTS

| | | |
|---|---|---|
| 2010/0319883 A1 | 12/2010 | Facusse |
| 2012/0170203 A1* | 7/2012 | Oberpriller et al. ..... 361/679.41 |
| 2012/0222444 A1 | 9/2012 | Li et al. |
| 2013/0114234 A1* | 5/2013 | Snider et al. .................. 361/816 |

FOREIGN PATENT DOCUMENTS

| | | |
|---|---|---|
| CN | 102088799 A | 6/2011 |
| CN | 202282872 U | 6/2012 |
| EP | 1404024 A2 | 3/2004 |
| WO | WO 93/14575 A1 | 7/1993 |

* cited by examiner

RADIO REMOTE UNIT DEVICE AND ASSEMBLY THEREOF

CROSS-REFERENCE TO RELATED APPLICATION

This application claims priority to Chinese Patent Application No. 201210286417.X, filed on Aug. 13, 2012, which is hereby incorporated by reference in its entirety.

TECHNICAL FIELD

Embodiments of the present invention relate to the field of radio communication, and in particular, to a radio remote unit (Radio Remote Unit, RRU for short) device and an assembly of the RRU device.

BACKGROUND

An RRU is a module capable of conversion between a radio frequency signal and a digital signal in a radio base station. To reduce loss of the radio frequency signal transmitted on a cable (from or to an antenna), the RRU needs to be installed as close to the antenna as possible, and is generally installed on the top of a transmitting tower or a building.

Because the frequency of radio frequency signals processed by an RRU varies, RRUs of different bands exist. Under the current technical conditions, an RRU generally supports one band. Currently, most radio communication operators generally own multiple bands. Under the multi-band circumstances, an operator has to deploy multiple RRUs to provide multi-band communication services. Generally, an RRU is installed in a chassis. Therefore, multiple chassis are needed in order to install multiple RRUs. The operator generally rents a tower for installing a chassis and the RRU in it, and the tower owner generally collects a rent according to the number of chassis. Therefore, installation of multiple chassis brings huge operation costs.

A common solution is to install multiple RRUs in a large chassis to make up a large RRU that supports multiple bands. In such a solution, a chassis is installed first, and then RRUs of different bands are installed in the chassis. However, the solution is costly because the number of RRUs installed in a chassis varies depending on different circumstances. If uniform chassis are applied to facilitate manufacturing, the space in some chassis will be idle.

SUMMARY

Embodiments of the present invention provide an RRU device. The number of RRUs can be configured flexibly as required by assembling such RRU devices on site, so that the manufacturing costs and operation costs of the RRUs are reduced.

In a first aspect, an embodiment of the present invention provides a radio remote unit device, where the radio remote unit device includes:
an enclosure; and a transceiver, a power amplifier, and a duplexer that are installed in the enclosure, where the enclosure includes a front-end plate and a back-end plate that are respectively set on two lengthwise ends of the enclosure, multiple parallel spaced heat sinks are set on two widthwise sides of the enclosure and between the front-end plate and the back-end plate, and the front-end plate and the back-end plate extend along a widthwise direction of the enclosure by a length which is greater than a length by which the heat sinks extend; and
a joint part set on the enclosure, where the joint part is used to fasten two side-by-side radio remote unit devices together, so that the front-end plate and the back-end plate of one radio remote unit device respectively lean closely against those of the other radio remote unit device and a preset gap is formed between widthwise ends of heat sinks on opposite sides of the two radio remote unit devices.

With reference to the first aspect, in a first feasible implementation manner, the joint part includes a screw hole set on the enclosure, a connection plate with a through-hole, and a screw. When connecting the two radio remote unit devices, the connection plate is connected between the two radio remote unit devices by using the screw hole and the screw.

With reference to the first aspect and/or the first feasible implementation manner of the first aspect, in a second feasible implementation manner, the screw hole is set in at least one of the following locations: a top end of the heat sink; a top end of the front-end plate and/or the back-end plate; and a plane of the front-end plate and/or the back-end plate.

With reference to the first aspect and/or the first and second feasible implementation manners of the first aspect, in a third feasible implementation manner, one widthwise side of the front-end plate and/or the back-end plate includes a concave part, and the other widthwise side includes a convex part that matches the concave part; when the two radio remote unit devices are adjoined together side by side, the concave part on one radio remote unit device assembles together with the convex part on the other radio remote unit device.

With reference to the first aspect and/or the first to third feasible implementation manners of the first aspect, in a fourth feasible implementation manner, the enclosure includes an external interface connector set at the bottom thereof and used to electrically connect the radio remote unit device to another network device.

With reference to the first aspect and/or the first to fourth feasible implementation manners of the first aspect, in a fifth feasible implementation manner, the radio remote unit device further includes a mount handle set on the enclosure.

In a second aspect, an assembly of radio remote unit devices is provided, where the assembly includes at least two radio remote unit devices adjoined side by side, where
the radio remote unit device includes:
an enclosure; and a transceiver, a power amplifier, and a duplexer that are installed in the enclosure, where the enclosure includes a front-end plate and a back-end plate that are respectively set on two lengthwise ends of the enclosure, multiple parallel spaced heat sinks are set on two widthwise sides of the enclosure and between the front-end plate and the back-end plate, and the front-end plate and the back-end plate extend along a widthwise direction of the enclosure by a length which is greater than a length by which the heat sinks extend; and
a joint part set on the enclosure, where the joint part is used to fasten two adjoined radio remote unit devices together, so that the front-end plate and the back-end plate of one radio remote unit device respectively lean closely against those of the other radio remote unit device and a preset gap is formed between widthwise ends of heat sinks on opposite sides of the two adjoined radio remote unit devices.

With reference to the second aspect, in a first feasible implementation manner, the joint part includes a screw hole set on the enclosure, a connection plate with a through-hole, and a screw. When connecting the two radio remote unit devices, the connection plate is connected between the two radio remote unit devices by using the screw hole and the screw.

With reference to the second aspect and/or the first feasible implementation manner of the second aspect, in a second feasible implementation manner, the screw hole is set in at least one of the following locations: a top end of the heat sink; a top end of the front-end plate and/or the back-end plate; and a plane of the front-end plate and/or the back-end plate.

With reference to the second aspect and/or the first and second feasible implementation manners of the second aspect, in a third feasible implementation manner, one widthwise side of the front-end plate and/or the back-end plate includes a concave part, and the other widthwise side includes a convex part that matches the concave part; when the two radio remote unit devices are adjoined together side by side, the concave part on one radio remote unit device assembles together with the convex part on the other radio remote unit device.

According to the embodiments of the present invention, at least two RRU devices may be assembled together into a multi-band RRU device assembly on an installation site. The implementation manners are flexible, and multiple RRU devices are adjoined closely to achieve high integrity. Moreover, each RRU device may be maintained independently, and change of any RRU device will not affect proper work of other RRU devices.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

Figure 1:
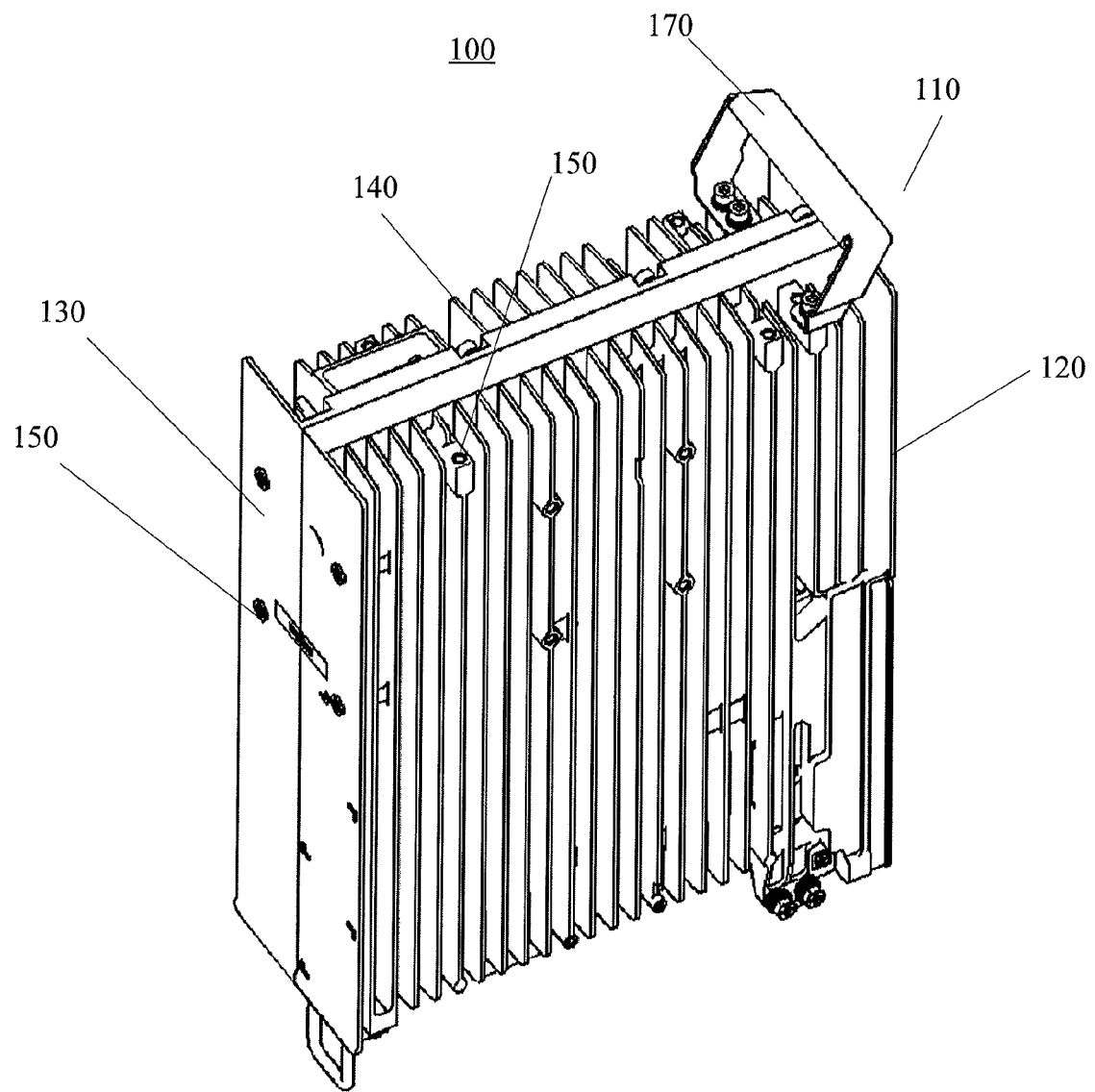
FIG. 1 is a perspective view of an RRU device according to an embodiment of the present invention.
Figure 2:
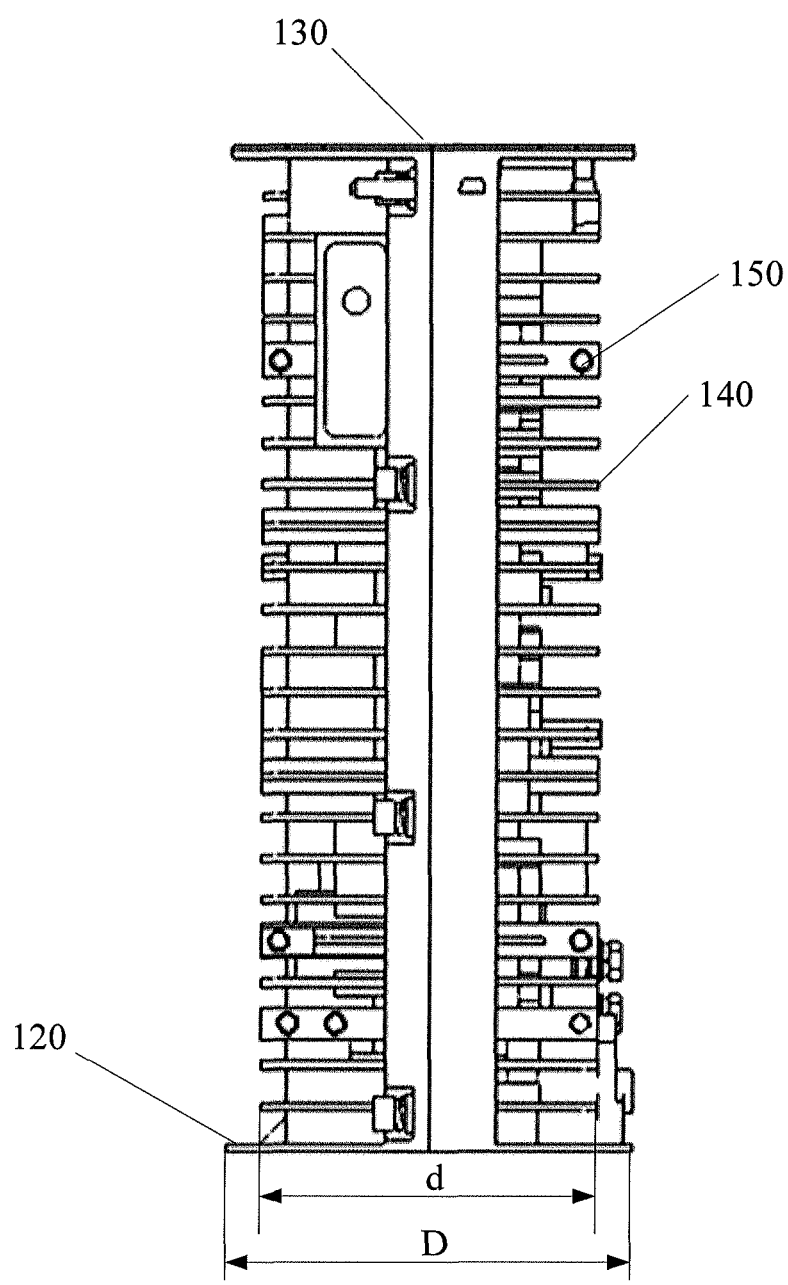
FIG. 2 is a top view of an RRU device according to an embodiment of the present invention.
Figure 3:
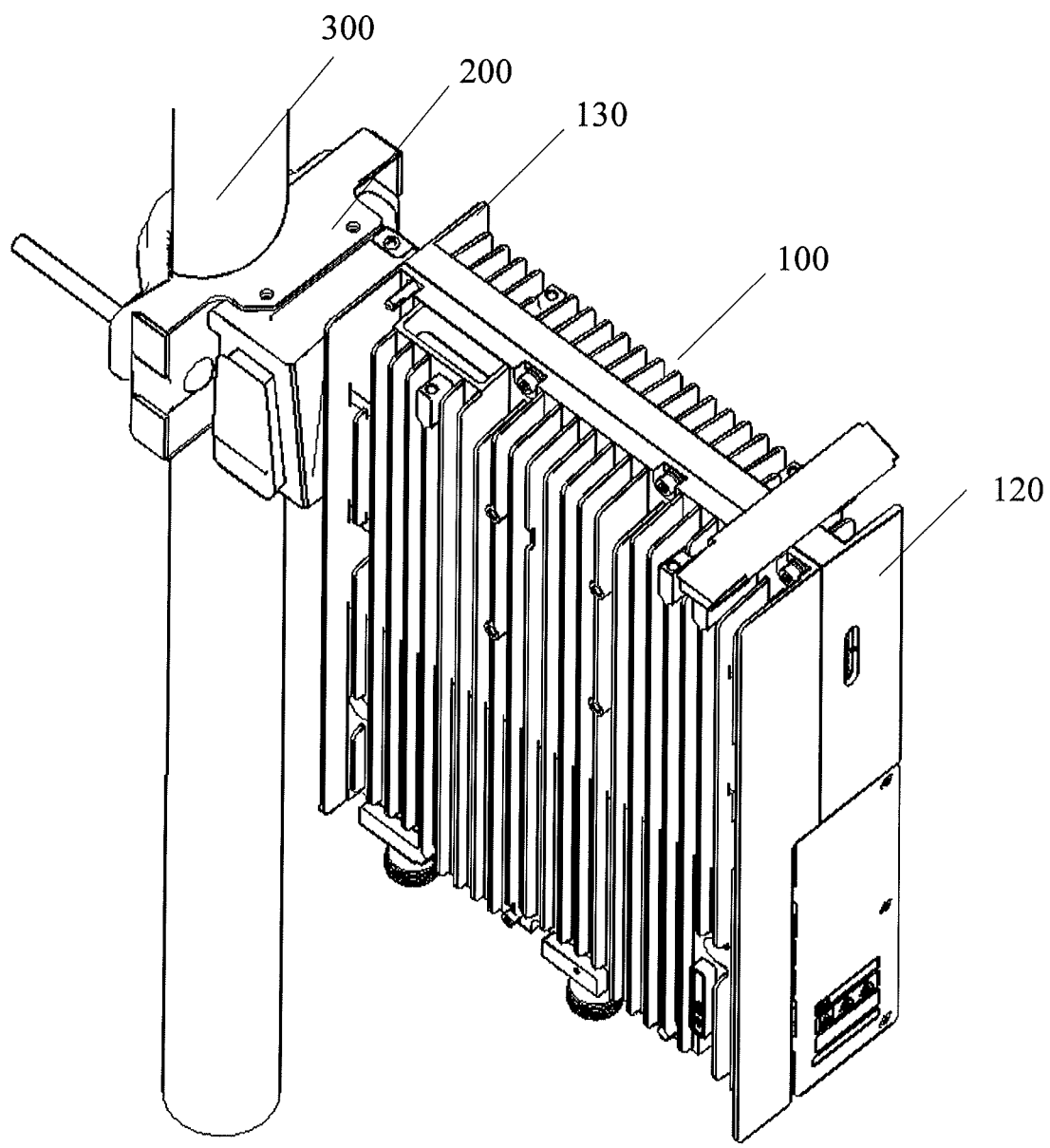
FIG. 3 is a perspective view of an RRU device in an installation state.

FIG. 1 is a perspective view of an RRU device according to an embodiment of the present invention. As shown in FIG. 1, the RRU device 100 includes an enclosure 110 and an RRU (not shown in the figure) installed in the enclosure. Persons skilled in the art understand that, the RRU generally includes a transceiver, a power amplifier, a duplexer, and so on. The enclosure 100 includes a front-end plate 120 and a back-end plate 130 that are set on two lengthwise ends of the enclosure. Multiple parallel spaced heat sinks 140 are set on two widthwise sides of the enclosure and between the front-end plate 120 and the back-end plate 130. As shown in FIG. 2, the front-end plate 120 and the back-end plate 130 extend along a widthwise direction of the enclosure by a length D which is greater than an extending length d of the heat sinks 140. The RRU device 100 may be installed on a communication tower by using a mount bracket. FIG. 3 is a schematic diagram of an RRU device 100 installed on a communication tower according to an embodiment of the present invention. In FIG. 3, the device is installed on a vertical pole 300 by using a mount part 200. In this case, the end plate far away from the vertical pole 300 may be called the front-end plate 120, and the end plate near the vertical pole 300 may be called the back-end plate 130.

It should be noted that, the enclosure in the embodiment of the present invention is basically a cubic shape, and is generally placed or installed vertically. In this case, when a watcher faces an RRU device, the end plate near the watcher may be defined as a front-end plate, and the end plate opposite to the front-end plate is a back-end plate. In a horizontal plane, a direction from the front-end plate to the back-end plate is called a lengthwise direction of the enclosure in the embodiments of the present invention, and a direction orthogonal to the lengthwise direction of the enclosure is a widthwise direction of the enclosure. The phrasing of "front", "back", "lengthwise", and "widthwise" herein is merely intended for convenient and clear description of the embodiments of the present invention, and shall not be construed as a limitation.

Figure 4:
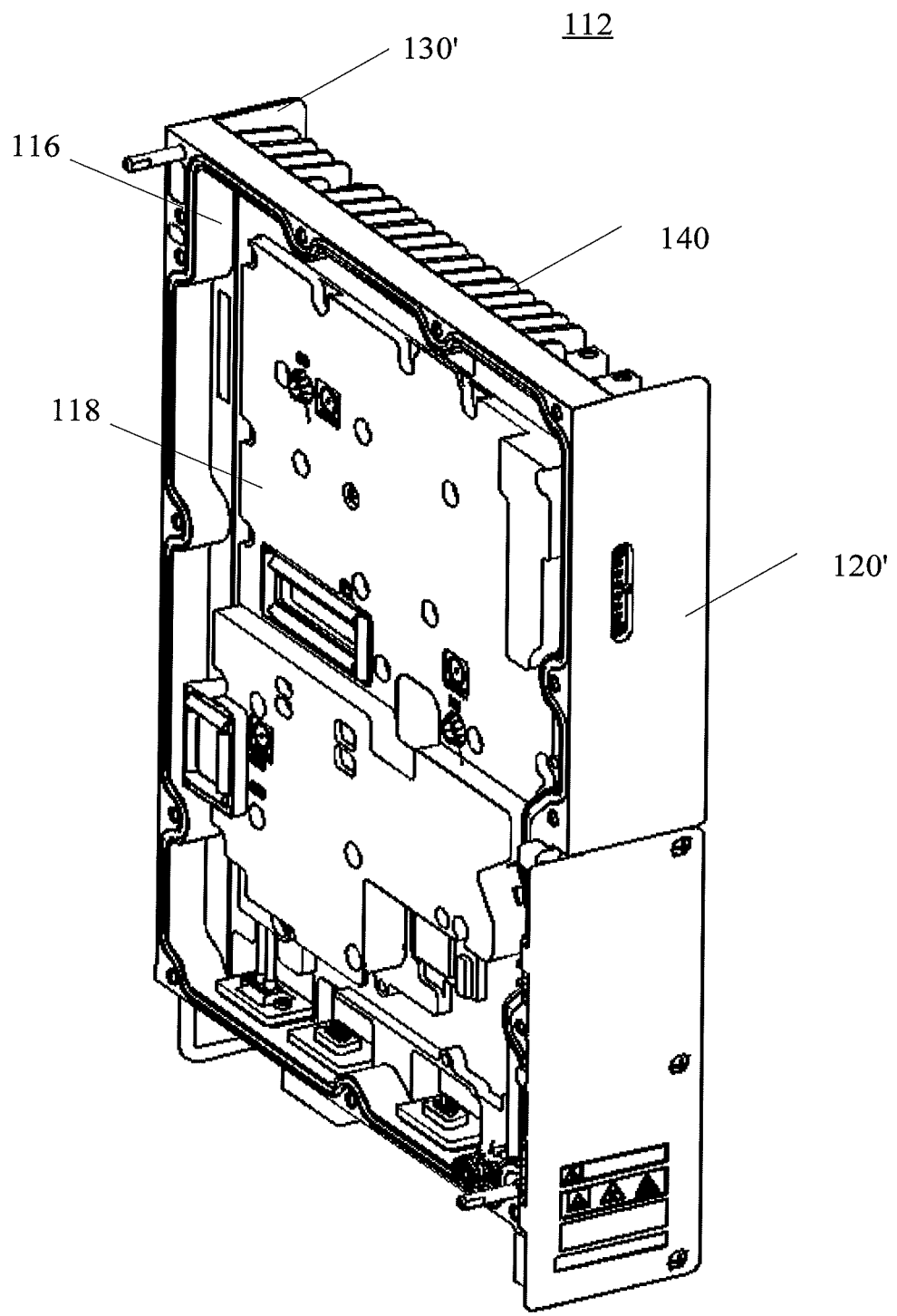
FIG. 4 is a perspective view of an enclosure half of an enclosure of an RRU device.

According to a feasible implementation manner of the embodiment of the present invention, the enclosure 110 may be composed of two enclosure halves 112. FIG. 4 is a perspective view of an enclosure half 112 of an RRU device 100 according to an embodiment of the present invention. The enclosure halves 112 are basically symmetric along a centerline of the enclosure 110, and are mutually clasped and fastened together by using a screw and a screw hole set on the enclosure half 112. Moreover, a sealing cushion (not shown) is set between the enclosure halves 112 to improve waterproof and dustproof effects of the enclosure 110. The enclosure half 112 includes an inner cavity 116, where an electronic part 118 is set in the inner cavity 116. The electronic part 118 herein may include the transceiver, the power amplifier, the duplexer, and so on. A front-end plate 120' of the enclosure half 112 is basically a half of the front-end plate 120 of the enclosure 110, and a back-end plate 130' is basically a half of the back-end plate 130 of the enclosure 110. When the two enclosure halves 112 are fastened together, the two front-end plates 120' assemble together into the front-end plate 120, and the back-end plates 130' assemble together into the back-end plate 130. Heat sinks 140 are set outside the enclosure half 112, and are located between the front-end plate 120' and the back-end plate 130'. The heat sinks 140 on the enclosure half 112 are basically parallel to one another and spaced to improve heat dissipation efficiency. As described above, the front-end plate 120' and the back-end plate 130' extend away from a lateral surface of the enclosure half 112 by a distance which is greater than a distance by which the heat sinks 140 extend away from the lateral surface.

Figure 6:
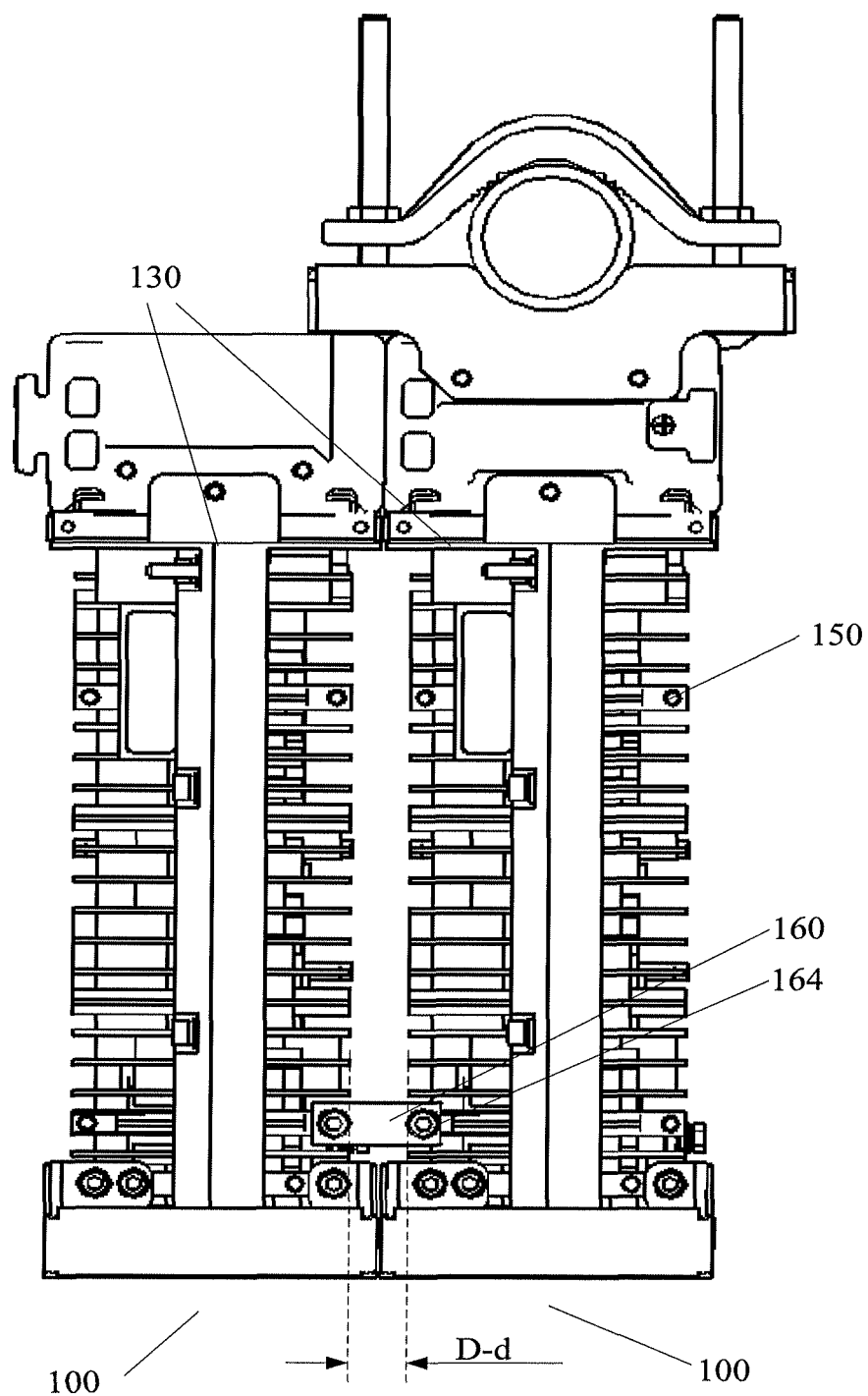
FIG. 6 is a top view of an assembly of two adjoined RRU devices.

The RRU device 100 further includes a joint part set on the enclosure 110, where the joint part is used to fasten two side-by-side RRU devices 100 together, so that the front-end plate 120 and the back-end plate 130 of one RRU device 100 respectively lean closely against those of the other RRU device 100 and a preset gap is formed between widthwise ends of the heat sinks 140 on opposite sides of the two RRU devices. For example, as shown in FIG. 6, the gap between the widthwise ends of the heat sinks 140 of the two adjoined RRU devices 100 is (D-d).

Figure 5:
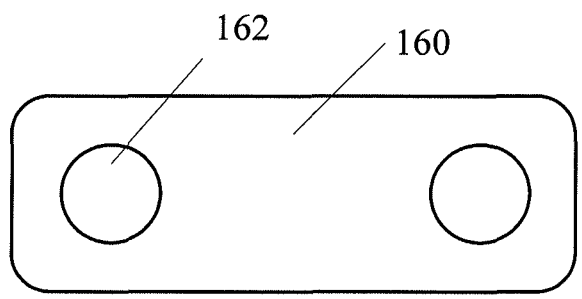
FIG. 5 is a top view of a connection plate for adjoining RRU devices.

According to the embodiment of the present invention, the joint part may include a screw hole 150 set on the enclosure 110, a connection plate 160 with a through-hole 162 (see FIG. 5), and a screw 164. When connecting the two RRU devices, the connection plate 160 is connected between the two RRU devices 100 by using the screw hole 150 and the screw. FIG. 5 is a schematic structural diagram of a feasible implementation manner of the connection plate 160. The connection plate 160 is roughly a fillet square sheet, and has two through-holes 162 for assembling screws.

In an optional solution, the screw holes 150 are set on top ends of the heat sinks 140 as shown in FIG. 1 and FIG. 2. In the embodiment of the present invention, the screw holes 150 are set on the top ends of the heat sinks 140 on two widthwise sides of the enclosure 110. In a case that the enclosure 110 is composed of two enclosure halves 112, the screw holes 150 are set on the top ends of the heat sinks 140 of each enclosure half 112, so that the RRU devices 100 can be mutually connected through the connection plate 160 conveniently. As required, the screw holes 150 may be set on a top end of one or more heat sinks 140. Multiple screw holes 150 are set and the two RRU devices 100 are connected through multiple connection plates 160, which can improve strength of adjoining the two RRU devices 100.

In another optional solution that is not shown, the screw holes 150 may be set on a top end of the front-end plate 120 and/or the back-end plate 130. In a case that the enclosure 110 is composed of two enclosure halves 112, for example, the screw holes are set on a top end of the front-end plate 120' and/or the back-end plate 130' of each enclosure half 112. The manner of setting is similar to the manner of setting the screw holes 150 on the top ends of the heat sinks 140. To improve the strength of adjoining, the screw holes 150 may be set on the top ends of both the front-end plate 120 and the back-end plate 130, and the two RRU devices are adjoined through two connection plates 160.

In another optional solution, the screw holes 150 may be set on planes of the front-end plate 120 and/or the back-end plate 130. For example, as shown in FIG. 1, the screw holes 150 are set on the back-end plate 130 at a certain height, and are set on two sides of the plane of the back-end plate 130 by using a centerline of the back-end plate 130 as a boundary, for example, two screw holes 150 are set on each side. In a case that the enclosure 110 is composed of two enclosure halves 112, the screw holes 150 are set on planes of the front-end plate 120' and/or the back-end plate 130' of each enclosure half 112. To improve the strength of adjoining, two screw holes 150 may be set on both the plane of the front-end plate 120 and the plane of the back-end plate 130, and the two RRU devices 100 are adjoined through four connection plates 160.

Figure 7:
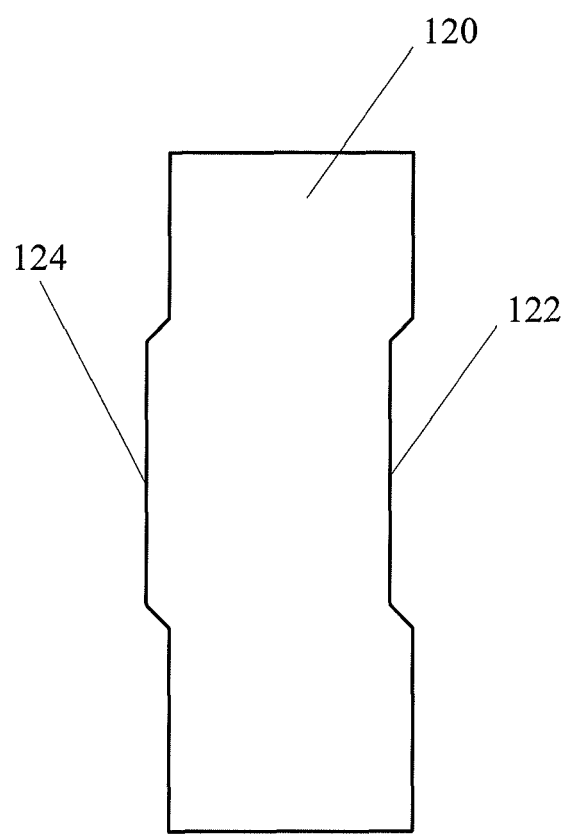
FIG. 7 is a front view of a front-end plate of an RRU device.
Figure 8:
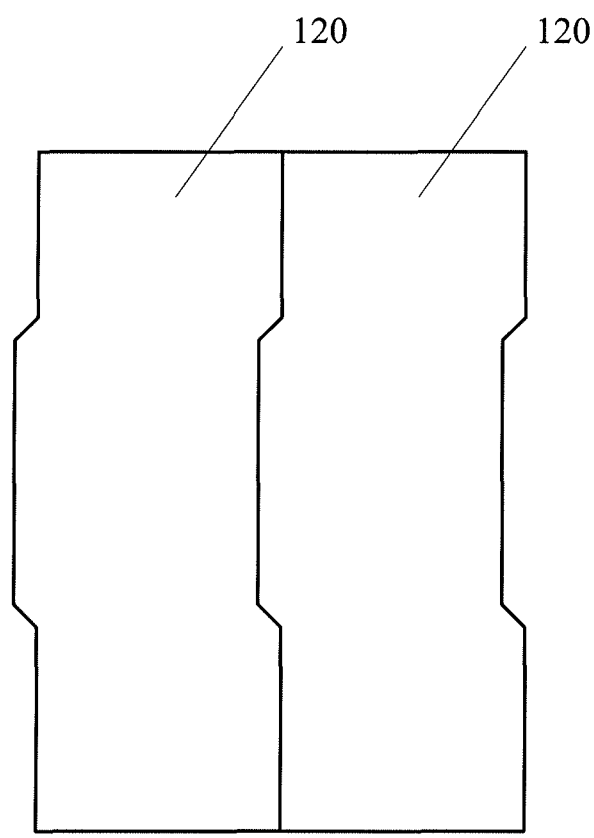
FIG. 8 is a front view of front-end plates of two adjoined RRU devices.

In another optional solution, as shown in FIG. 7, a widthwise side of the front-end plate 120 includes a concave part 122, and the other widthwise side includes a convex part 124 that matches the concave part 122. When two RRU devices 100 are adjoined side by side, the concave part 122 on one RRU device assembles together with the convex part 124 on the other RRU device as shown in FIG. 8, so as to make the two RRU devices 100 adjoined more closely and improve integrity of the device. Optionally, similar to the concave part 122 and the convex part 124 on the front-end plate 120, a concave part and a convex part may be included on the back-end plate 130 correspondingly. Optionally, both the front-end plate 120 and the back-end plate 130 may include a concave part and a convex part simultaneously to further improve integrity of two adjoined RRU devices. In a case that the enclosure 110 is composed of two enclosure halves 112, the concave part may be set on the front-end plate 120' and the back-end plate 130' of one enclosure half 112, and the convex part may be set on the front-end plate 120' and the back-end plate 130' of the other enclosure half 112.

Optionally, multiple concave parts 122 and convex parts 124 shown in FIG. 7 may be set to further improve integrity of adjoined RRU devices.

As shown in FIG. 1, the RRU device 100 further includes a mount handle 170 set on the enclosure 110. In the implementation manner shown in the figure, the mount handle 170 is set on a side of the top of the enclosure 110 at a certain angle such as 45 degrees against the top of the enclosure 100. The mount handle 170 may be installed on the enclosure 110 through screw connection to facilitate installation and transportation operations of the RRU device 100.

Figure 9:
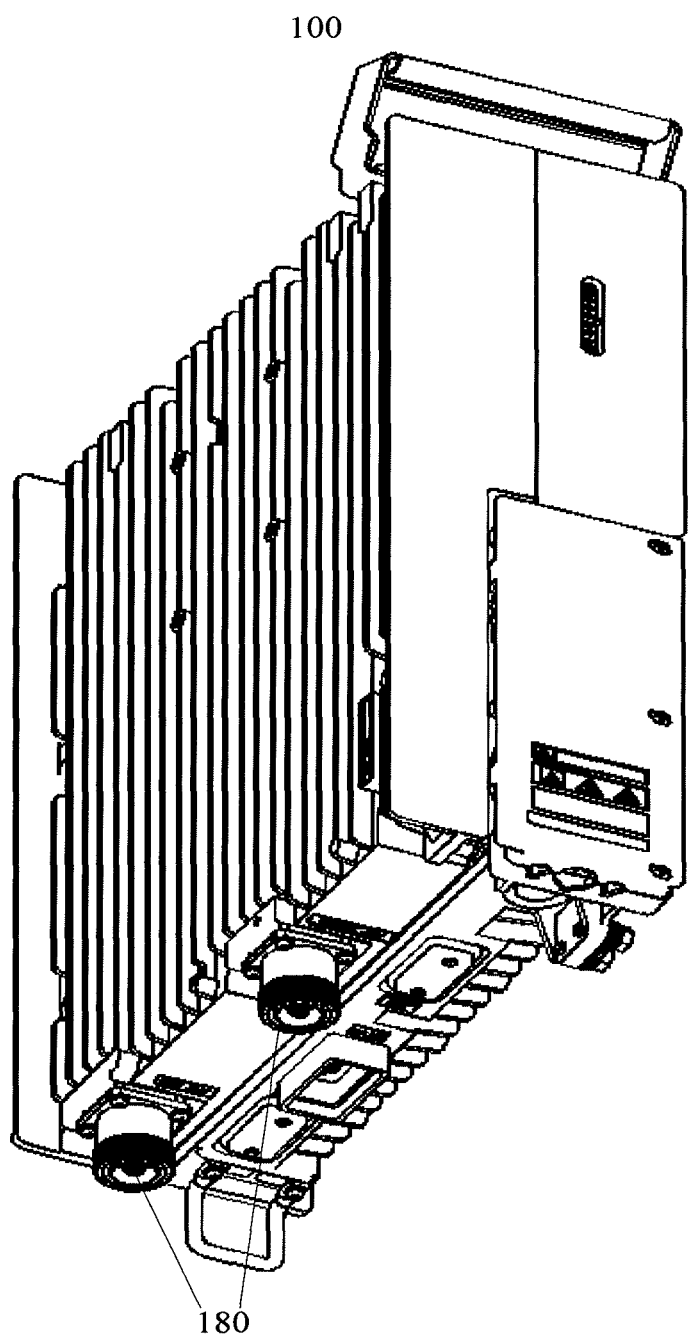
FIG. 9 is a perspective view of an RRU device according to an embodiment of the present invention.

As shown in FIG. 9, the RRU device 100 further includes an external connection port 180 set at the bottom of the enclosure 110. FIG. 9 is a perspective view of an RRU device 100 according to an embodiment of the present invention, and shows two external connection ports 180 set at a side of the bottom the enclosure 110. In a case that the enclosure 110 is composed of two enclosure halves 112, the external connection port 180 may be set on one of the enclosure halves 112. The external connection port 180 leads to the interior of the enclosure 110, and is used to electrically connect an electronic part of the RRU device 100 to an external device. The external connection port 180 set at the bottom of the enclosure is good for leading a transmission line out of a tower where the RRU device 100 is installed, and good for protecting the external connection port against water.

Figure 10:
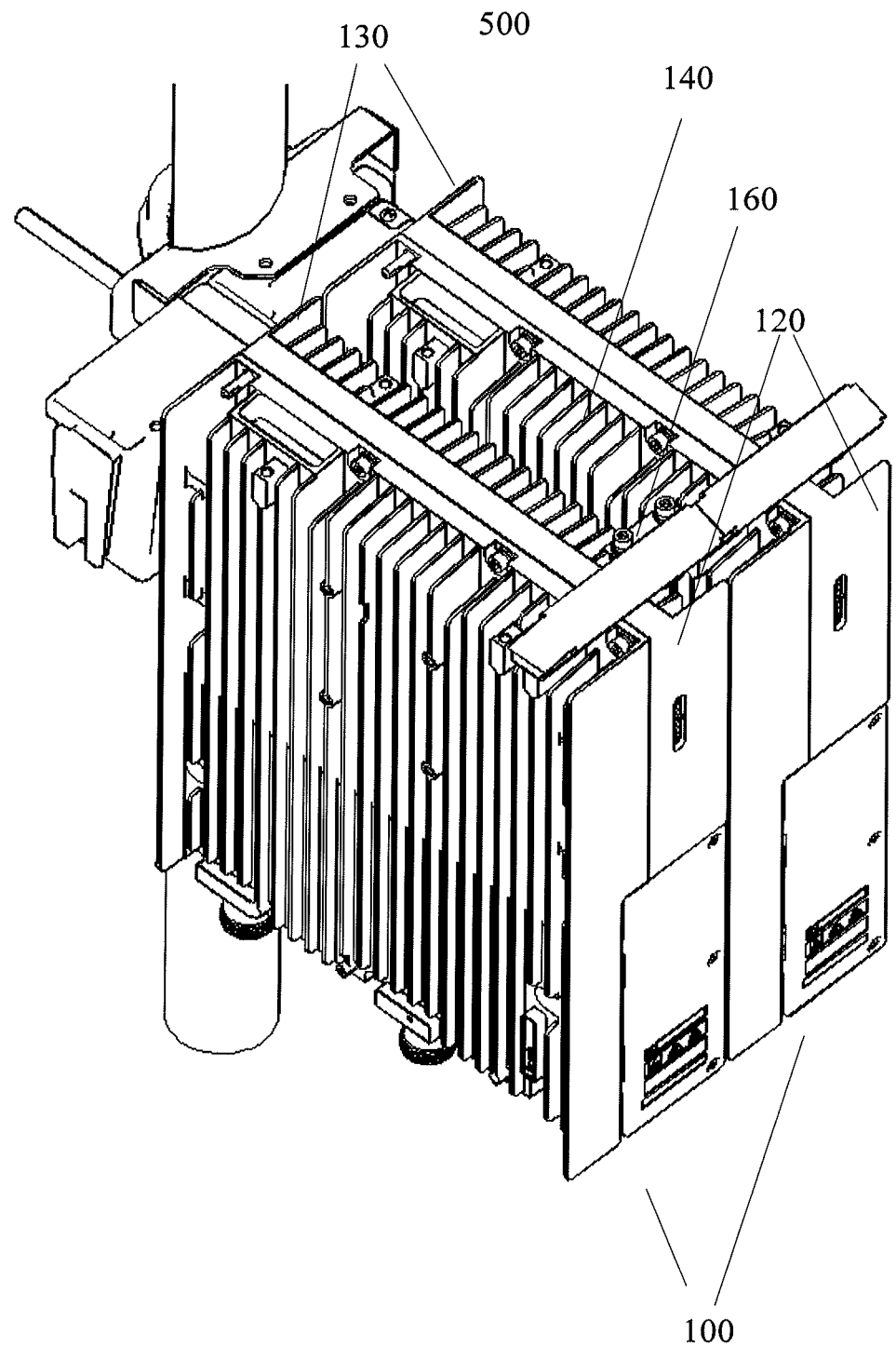
FIG. 10 is a perspective view of an assembly of two RRU devices being installed.

FIG. 10 is a perspective view of an assembly 500 of two adjoined RRU devices 100 according to an embodiment of the present invention. As shown in FIG. 6 and FIG. 10, the assembly 500 includes two RRU devices 100. The two RRU devices are installed together side by side. The front-end plate 120 and the back-end plate 130 of the enclosure 110 of one RRU device 100 are respectively aligned with the front-end plate 120 and the back-end plate 130 of the enclosure 110 of the other RRU device 100. The two RRU devices are adjoined through a joint part. Specifically, according to the solution shown in FIG. 10, through screws, the connection plate 160 is connected to screw holes that are set on top ends of heat sinks 140 of the two RRU devices 100, thereby adjoining the two RRU devices 100.

In an implementation manner in which the screw holes of the joint part are set on a top end of the front-end plate and/or the back-end plate or set on planes of the front-end plate and/or the back-end plate, an installation method similar to that shown in FIG. 10 may be adopted, and the two RRU devices 100 are adjoined through the connection plate 160 and screws.

The assembly 500 may be installed in a communication tower by using a mount part. With the design in the embodiment of the present invention, the two RRU devices are adjoined closely to achieve high integrity, and the assembly may be treated as a chassis in the engineering design and commercial operation, thereby saving costs for the operator who owns the RRU devices. Moreover, a preset distance such as the distance (D-d) is kept between widthwise ends of the heat sinks of the two adjoined RRU devices, which facilitates heat dissipation of each RRU device and prevents the heat dissipation functions from affecting each other.

Figure 11:
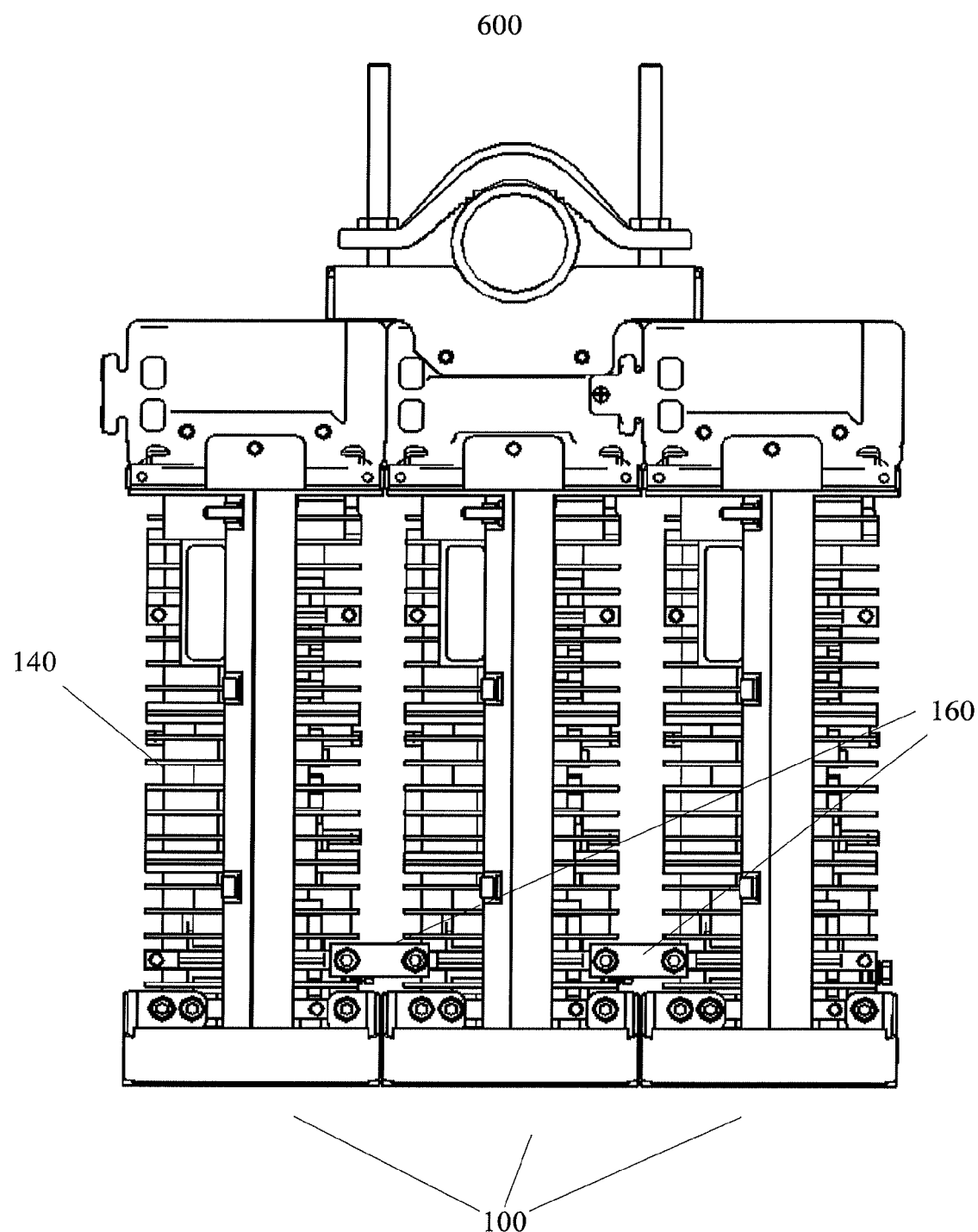
FIG. 11 is a top view of an assembly of three adjoined RRU devices.
Figure 12:
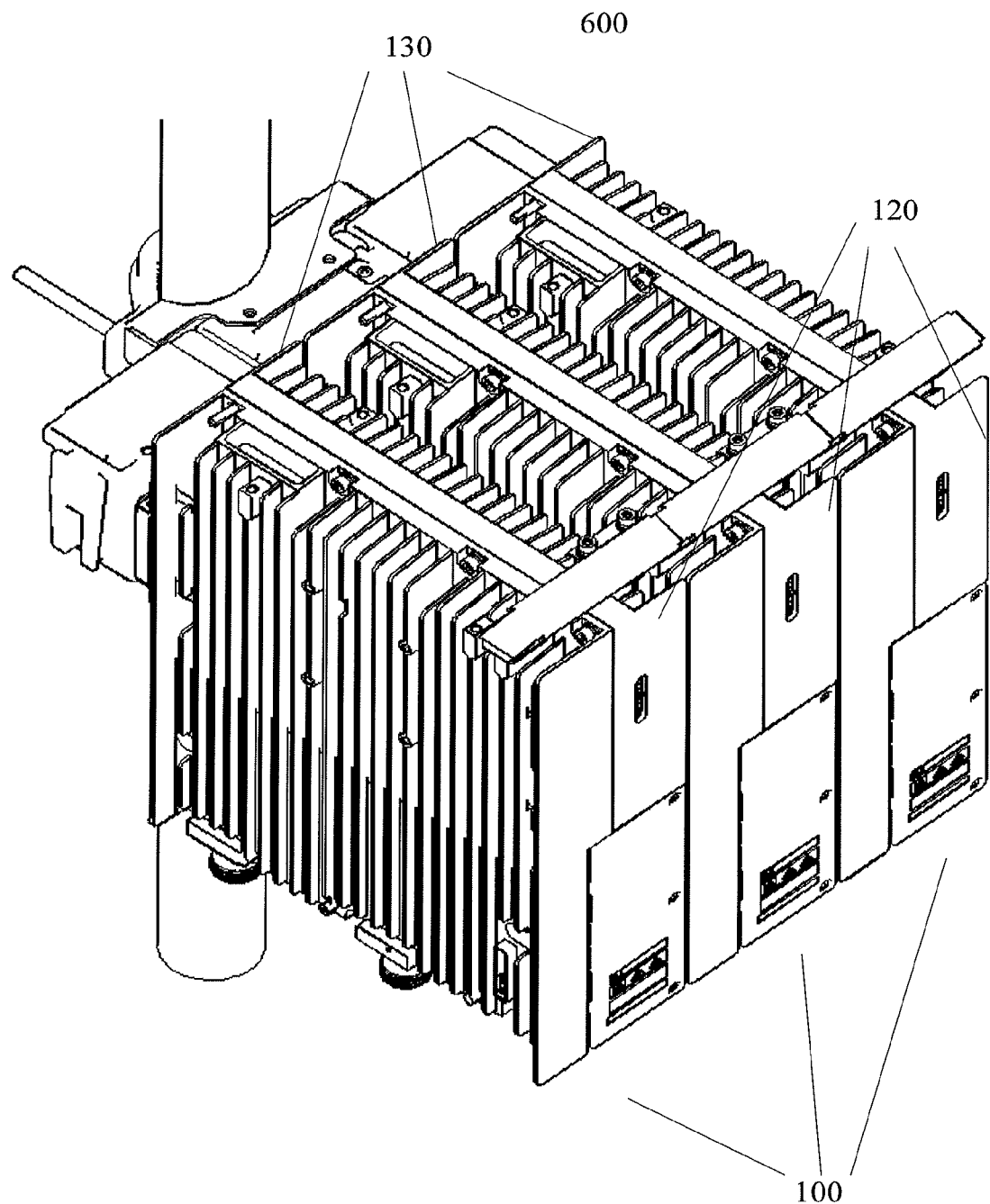
FIG. 12 is a perspective view of an assembly of three RRU devices being installed.

It should be noted that, according to the embodiment of the present invention, multiple RRU devices 100 may be adjoined together to form a whole. FIG. 11 is a top view of an assembly 600 of three adjoined RRU devices 100. FIG. 12 is a perspective view of an assembly 600 of three adjoined RRU devices 100. As shown in FIG. 11 and FIG. 12, two adjacent RRU devices 100 are adjoined through a joint part, so that a front-end plate and a back-end plate of one RRU device respectively lean closely against those of the other RRU device and a preset gap is formed between top ends of heat sinks 140 on opposite sides of the adjacent RRU devices 100.

Understandably, according to the solution shown in FIG. 11 and FIG. 12, through screws, the connection plate 160 is connected to screw holes that are set on top ends of the heat sinks 140 of the two adjacent RRU devices 100, thereby adjoining the two adjacent RRU devices 100.

In an implementation manner in which the screw holes of the joint part are set on a top end of the front-end plate and/or the back-end plate or set on planes of the front-end plate and/or the back-end plate, an installation method similar to that shown in FIG. 11 may be adopted, and the two adjacent RRU devices 100 are adjoined through the connection plate 160 and screws to form an assembly 600. In this way, the assembly may be extended to include more RRU devices. The RRU devices are adjoined closely to achieve high integrity, and may be treated as one chassis in commercial operation.

According to the embodiment of the present invention, at least two RRU devices may be assembled together into a multi-band RRU device assembly on an installation site. The implementation manners are flexible, and multiple RRU devices are adjoined closely to achieve high integrity. Moreover, each RRU device may be maintained independently, and change of any RRU device will not affect proper work of other RRU devices.

The foregoing descriptions are merely specific embodiments of the present invention, but are not intended to limit the protection scope of the present invention. Any variation or replacement readily figured out by persons skilled in the art within the technical scope disclosed in the present invention shall fall within the protection scope of the present invention. Therefore, the protection scope of the present invention shall be subject to the protection scope of the claims.

What is claimed is:

1. A radio remote unit device, comprising:
   an enclosure; and a transceiver, a power amplifier, and a duplexer that are installed in the enclosure, wherein the enclosure comprises a front-end plate and a back-end plate that are respectively set on two lengthwise ends of the enclosure, a plurality of parallel spaced heat sinks are set on two widthwise sides of the enclosure and between the front-end plate and the back-end plate, and the front-end plate and the back-end plate extend along a widthwise direction of the enclosure by a length which is greater than a length by which the plurality of heat sinks extend; and
   a joint part set on the enclosure, wherein the joint part is configured to fasten the radio remote unit device and a second radio remote unit device together, so that the front-end plate and the back-end plate of the radio remote unit device respectively lean closely against those of the second radio remote unit device and a preset gap is formed between widthwise ends of the plurality of heat sinks and a second plurality of heat sinks respectively on opposite sides of the radio remote unit device and the second radio remote unit device.

2. The radio remote unit device according to claim 1, wherein:
   the joint part comprises a screw hole set on the enclosure, a connection plate with a through-hole, and a screw; when connecting two radio remote unit devices, the connection plate is connected between the two radio remote unit devices by using the screw hole and the screw.

3. The radio remote unit according to claim 2, wherein:
   the screw hole is set in at least one of the following locations: a top end of at least one of the plurality of heat sinks; a top end of the front-end plate and/or the back-end plate; and a plane of the front-end plate and/or the back-end plate.

4. The radio remote unit according to claim 1, wherein:
   one widthwise side of the front-end plate and/or the back-end plate comprises a concave part, and the other widthwise side comprises a convex part that matches the concave part; when two radio remote unit devices are adjoined together side by side, the concave part on one radio remote unit device assembles together with the convex part on the other radio remote unit device.

5. The radio remote unit according to claim 1, wherein:
   the enclosure comprises an external interface connector set at the bottom thereof and used to electrically connect the radio remote unit device to another network device.

6. The radio remote unit according to claim 1, wherein:
   the radio remote unit device further comprises a mount handle set on the enclosure.

7. An assembly, wherein:
   the assembly comprises a first and second radio remote unit devices adjoined together side by side; wherein
   the first radio remote unit device comprises:
   an enclosure; and a transceiver, a power amplifier, and a duplexer that are installed in the enclosure, wherein the enclosure comprises a front-end plate and a back-end plate that are respectively set on two lengthwise ends of the enclosure, a plurality of parallel spaced heat sinks are set on two widthwise sides of the enclosure and between the front-end plate and the back-end plate, and the front-end plate and the back-end plate extend along a widthwise direction of the enclosure by a length which is greater than a length by which the plurality of heat sinks extend; and
   a joint part set on the enclosure, wherein the joint part is used to fasten two the first and second adjoined radio remote unit devices together, so that the front-end plate and the back-end plate of the first radio remote unit device respectively lean closely against those of the second radio remote unit device and a preset gap is formed between widthwise ends of the plurality of heat sinks on opposite sides of the first and second adjoined radio remote unit devices.

8. The assembly according to claim 7, wherein:
   the joint part comprises a screw hole set on the enclosure, a connection plate with a through-hole, and a screw; when connecting the two adjacent radio remote unit devices, the connection plate is connected between the two adjacent radio remote unit devices by using the screw hole and the screw.

9. The assembly according to claim 8, wherein:
the screw hole is set in at least one of the following locations: a top end of at least one of the plurality of heat sinks; a top end of the front-end plate and/or the back-end plate; and a plane of the front-end plate and/or the back-end plate.

10. The assembly according to claim 7, wherein:
one widthwise side of the front-end plate and/or the back-end plate comprises a concave part, and the other widthwise side comprises a convex part that matches the concave part; when the two adjacent radio remote unit devices are adjoined together side by side, the concave part on one radio remote unit device assembles together with the convex part on the other radio remote unit device.

* * * * *